(12) United States Patent
Taniguchi et al.

(10) Patent No.: US 10,979,014 B2
(45) Date of Patent: Apr. 13, 2021

(54) VOLTAGE FILTER AND POWER CONVERSION DEVICE

(71) Applicant: Hitachi, Ltd., Tokyo (JP)

(72) Inventors: Hitoshi Taniguchi, Tokyo (JP); Hiroki Funato, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 16/682,032

(22) Filed: Nov. 13, 2019

(65) Prior Publication Data

US 2020/0162051 A1    May 21, 2020

(30) Foreign Application Priority Data

Nov. 15, 2018  (JP) .............................. JP2018-214626

(51) Int. Cl.
| | | |
|---|---|---|
| *H03H 7/01* | (2006.01) | |
| *H02M 3/156* | (2006.01) | |
| *H02M 7/5395* | (2006.01) | |

(52) U.S. Cl.
CPC .......... *H03H 7/0153* (2013.01); *H02M 3/156* (2013.01); *H02M 7/5395* (2013.01)

(58) Field of Classification Search
None
See application file for complete search history.

(56) References Cited

U.S. PATENT DOCUMENTS

| | | | | |
|---|---|---|---|---|
| 9,633,794 | B2* | 4/2017 | Jun .......................... | H01G 4/38 |
| 9,992,907 | B2* | 6/2018 | Okamura ................. | H05K 7/20 |
| 10,193,488 | B2* | 1/2019 | Li ............................ | H02P 27/06 |
| 10,263,589 | B2* | 4/2019 | Tsubaki .................... | H04B 3/26 |
| 10,277,116 | B2* | 4/2019 | Naito ....................... | H02M 7/48 |
| 10,544,805 | B2* | 1/2020 | Ambo ...................... | F04B 35/04 |
| 2013/0264984 | A1* | 10/2013 | Tamura .................... | H02M 7/48 |
| | | | | 318/400.27 |
| 2016/0126919 | A1 | 5/2016 | Tsubaki et al. | |
| 2018/0049314 | A1 | 2/2018 | Amaducci et al. | |
| 2018/0123445 | A1 | 5/2018 | Nishizawa et al. | |
| 2019/0305647 | A1* | 10/2019 | Ambo .................. | B60H 1/3226 |
| 2019/0305708 | A1* | 10/2019 | Chretien ................. | H02M 1/32 |

FOREIGN PATENT DOCUMENTS

| | | |
|---|---|---|
| JP | 2006013168 A | 1/2006 |
| JP | 2006060876 A | 3/2006 |
| JP | 2008043023 A | 2/2008 |
| JP | 3142501 U | 6/2008 |
| JP | 2011199039 A | 10/2011 |
| JP | 2012178937 A | 9/2012 |
| JP | 6113292 B2 | 4/2017 |
| WO | 2015040665 A1 | 3/2015 |

OTHER PUBLICATIONS

Search Report dated Apr. 17, 2020 in corresponding European Application No. 19208825.0.

* cited by examiner

*Primary Examiner* — Jeffery S Zweizig
(74) *Attorney, Agent, or Firm* — Miles & Stockbridge, P.C.

(57) ABSTRACT

To improve the performance of the voltage filter. Rather than reducing an area of a region surrounded by a closed loop formed in a voltage filter 12A, an induced electromotive force generated in the voltage filter 12A itself is reduced by forming a pair of a closed loop CA and a closed loop CB in which the directions of the generated induced electromotive forces are opposite to each other by making a wiring 100 (anode wiring) intersect a wiring 200 (cathode wiring).

6 Claims, 12 Drawing Sheets

VOLTAGE FILTER AND POWER CONVERSION DEVICE

BACKGROUND OF THE INVENTION

1. Field of the Invention

The present invention relates to a voltage filter and a power conversion device.

2. Description of the Related Art

JP-A-2008-43023 (Patent Literature 1) describes a technique relating to a pair of bus bars intersecting with each other and disposed in parallel between a power module portion and a smoothing capacitor portion.

JP-A-2012-178937 (Patent Literature 2) describes a technique for causing a first conductor plate and a second conductor plate to intersect halfway with respect to a driver circuit base plate.

Japanese Patent No. 6113292 (Patent Literature 3) describes a technique in which wirings which connect X capacitors intersect an odd number of times.

Japanese Utility Model Registration No. 3142501 (Patent Literature 4) describes a technique in which connection patterns that connect both ends of a smoothing capacitor with a pair of output terminals intersect on a single-sided printed wiring board.

SUMMARY OF THE INVENTION

A power conversion device including an inverter is a device which generates AC power from DC power such as a battery. The power conversion device is used, for example, in a power electronics system of an electric vehicle for obtaining mechanical energy from electric energy.

The power conversion device includes, for example, the inverter composed of a switching element, and a control unit which controls on/off of the switching element, and converts the DC power into the AC power by controlling the on/off of the switching element by the control unit.

Here, since a rapid voltage change or a rapid current change occurs when the switching element is turned on/off, high frequency noise accompanying the rapid voltage change or the rapid current change (surge voltage or surge current) is generated from the switching element. The high frequency noise generated in the switching element is superimposed on, for example, a cable which connects the power conversion device with a power source. When the high frequency noise is superimposed on the cable as described above, electromagnetic waves are emitted from the cable as interference waves due to the high frequency noise. As a result, an adverse effect which is represented by the malfunction of an electronic device (such as an ECU) disposed around the cable is exerted on the electronic device.

For this reason, the power conversion device is provided with a voltage filter which reduces the high frequency noise generated in the switching element. That is, in addition to the inverter which includes the switching element and the control unit which controls the inverter, the power conversion device is provided with the voltage filter for absorbing the high frequency noise generated in the switching element. Accordingly, the high frequency noise generated in the switching element is reduced by, for example, the voltage filter provided inside the power conversion device before being superimposed on the cable which connects the power conversion device with the power source. For this reason, for example, it is possible to reduce the adverse effect exerted on the electronic device disposed around the cable due to superimposition of the high frequency noise on the cable which connects the power conversion device with the power source.

However, according to the study of the inventor, the rapid voltage change or the rapid current change accompanying the on/off of the switching element generates not only the high frequency noise transmitted through a wiring (electric path) but also a temporally changing magnetic field around the switching element. The inventor newly finds that the temporally changing magnetic field induces the generation of electromagnetic induction noise from the voltage filter. That is, while the voltage filter is effective in reducing the high frequency noise transmitted through the wiring, the voltage filter itself becomes a generation source of the electromagnetic induction noise with the adverse effect of the changing magnetic field due to the rapid voltage change or the rapid current change accompanying the on/off of the switching element. Therefore, even if the high frequency noise accompanying the on/off of the switching element can be absorbed by the voltage filter, when the electromagnetic induction noise generated from the voltage filter itself is superimposed on, for example, the cable which connects the power conversion device with the power source, the adverse effect is exerted on the electronic device disposed around the cable. Therefore, in the power conversion device including the switching element and the voltage filter, a device for reducing the electromagnetic induction noise generated from the voltage filter itself is desired.

Other problems and novel characteristics will be apparent from the account of the description and the accompanying drawings.

A voltage filter according to one embodiment includes a first cathode terminal and a first anode terminal aligned in a second direction orthogonal to a first direction; a second anode terminal aligned with the first cathode terminal in the first direction; and a second cathode terminal aligned with the first anode terminal in the first direction. The voltage filter according to one embodiment includes a cathode wiring which electrically connects the first cathode terminal with the second cathode terminal; an anode wiring which electrically connects the first anode terminal with the second anode terminal; a first capacitive element provided between the cathode wiring and the anode wiring; and a series capacitive element which includes a second capacitive element and a third capacitive element connected in series between the cathode wiring and the anode wiring. Here, the cathode wiring and the anode wiring intersect at an intersection. The first capacitive element and the series capacitive element are provided at positions where the intersection is sandwiched.

According to the embodiment, the performance of the voltage filter can be improved.

DESCRIPTION OF THE PREFERRED EMBODIMENTS

Figure 1:
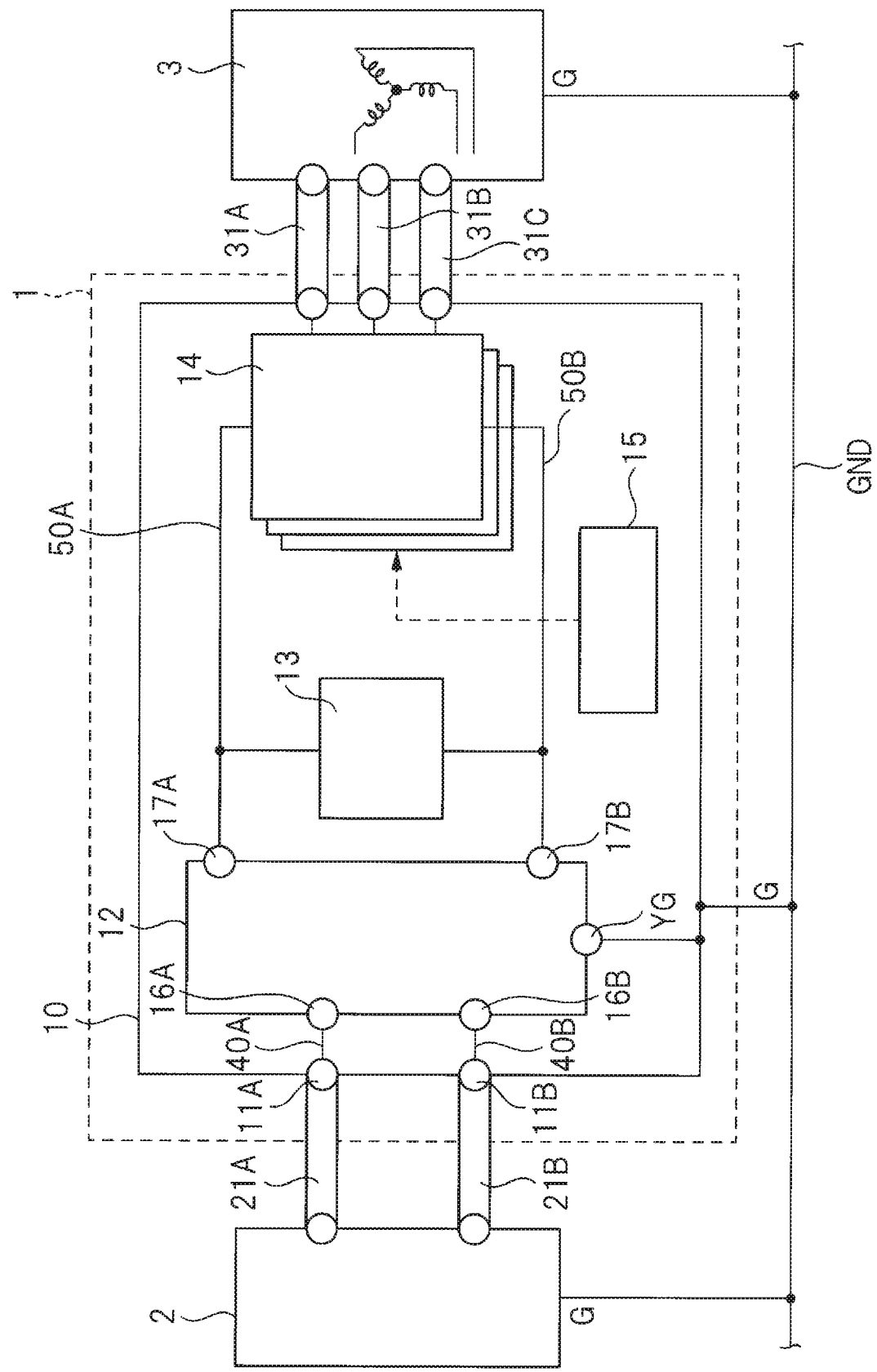
FIG. 1 is a block diagram showing a configuration example of a power electronics system including a power conversion device according to an embodiment.

In all the drawings for illustrating the embodiments, the same members are denoted by the same reference numerals in principle, and the repetitive description thereof will be omitted. In order to make the drawings easy to understand, hatching may be attached even in a plan view.

<Configuration of Power Conversion Device>

FIG. 1 is a block diagram showing a configuration example of a power electronics system including a power conversion device according to the present embodiment. In the present embodiment, the power electronics system including the power conversion device which includes such as an inverter for driving a motor of an electric vehicle or a hybrid vehicle will be described as an example.

In FIG. 1, a power conversion device 1 according to the present embodiment includes a housing 10. The power conversion device 1 is configured by storing various circuit blocks and elements in the housing 10. In FIG. 1, among the circuit blocks and the elements stored in the housing 10, only those necessary for the description are illustrated. FIG. 1 shows a power source 2 for supplying a DC voltage to the power conversion device 1 and an electric motor 3 driven by an AC voltage generated by the power conversion device 1.

The power source 2 is obtained by converting a battery or an AC power source into the DC voltage by a converter. For example, an inverter for driving a hybrid vehicle uses a high voltage battery of several hundred volts for the power source 2. For example, since a medical device such as an X-ray diagnostic device uses a commercial AC power source, the AC power source is converted into a DC power source by using a rectifier circuit or the converter. An anode electrode of the power source 2 is connected to a high-voltage anode cable 21A, and a cathode electrode of the power source 2 is connected to a high-voltage cathode cable 21B. Although not particularly limited, a housing of the power source 2 is set as a frame ground G, and the housing of the power source 2 is connected to a ground line GND. The high-voltage anode cable 21A is connected to an anode power source input terminal 11A of the power conversion device 1, and the high-voltage cathode cable 21B is connected to a cathode power source input terminal 11B of the power conversion device 1.

The electric motor 3 is not particularly limited, but is configured by a three-phase electric motor. The electric motor 3 includes a rotor (not shown) and a stator (not shown), and three coils are disposed on the stator. The power conversion device 1 generates a three-phase AC voltage and supplies the AC voltage to the three coils via high-voltage AC cables 31A to 31C. Accordingly, the three coils generate a magnetic field corresponding to the three-phase AC voltage to make the rotor rotate. Although not particularly limited, a housing of the electric motor 3 is set as a frame ground G and is connected to the ground line GND.

Next, the configuration of the power conversion device 1 will be described. The power conversion device 1 includes a voltage filter 12, a smoothing capacitor 13, a semiconductor module 14 (inverter), and a control unit 15 which controls the semiconductor module 14.

In the power conversion device 1, the anode power source input terminal 11A and an anode terminal 16A of the voltage filter 12 are connected by a bus bar 40A, and the cathode power source input terminal 11B and a cathode terminal 16B of the voltage filter 12 are connected by a bus bar 40B. An anode terminal 17A of the voltage filter 12, an anode terminal of the semiconductor module 14 and an anode terminal of the smoothing capacitor 13 are connected by a bus bar 50A, and a cathode terminal 17B of the voltage filter 12, a cathode terminal of the semiconductor module 14 and a cathode terminal of the smoothing capacitor 13 are connected by a bus bar 50B. Output terminals of the semiconductor module 14 and the high-voltage AC cables 31A to 31C are connected by bus bars and connectors as necessary. A ground terminal YG of the voltage filter 12 is connected to the frame ground G of the housing 10. Further, the frame ground G of the housing 10 is connected to the ground line GND.

The semiconductor module 14 includes a semiconductor element (power transistor) represented by an IGBT or a power MOSFET, but is not limited thereto. The semiconductor module 14 is configured to generate a desired voltage or current by switching (on/off) the semiconductor element under control of the control unit 15.

Since switching current and switching voltage of high frequency are generated in the semiconductor element at the time of switching, the smoothing capacitor 13 for smoothing the switching current and the switching voltage is generally used. The smoothing capacitor has, for example, a configuration in which a plurality of capacitors having a capacitance of about several tens of microfarads are connected in parallel, but not limited thereto. The bus bar 50A and the bus bar 50B are preferably made of copper, but are not limited thereto.

Further, an output voltage of the semiconductor module 14 is supplied to the electric motor 3 via the high-voltage AC cables 31A to 31C. The switching operation of the semiconductor module 14 is controlled by the control unit 15. The configurations of the semiconductor module 14 and the electric motor 3 are not limited to those described above.

<Circuit Configuration of Voltage Filter>

Next, a circuit configuration of the voltage filter will be described.

Figure 2:
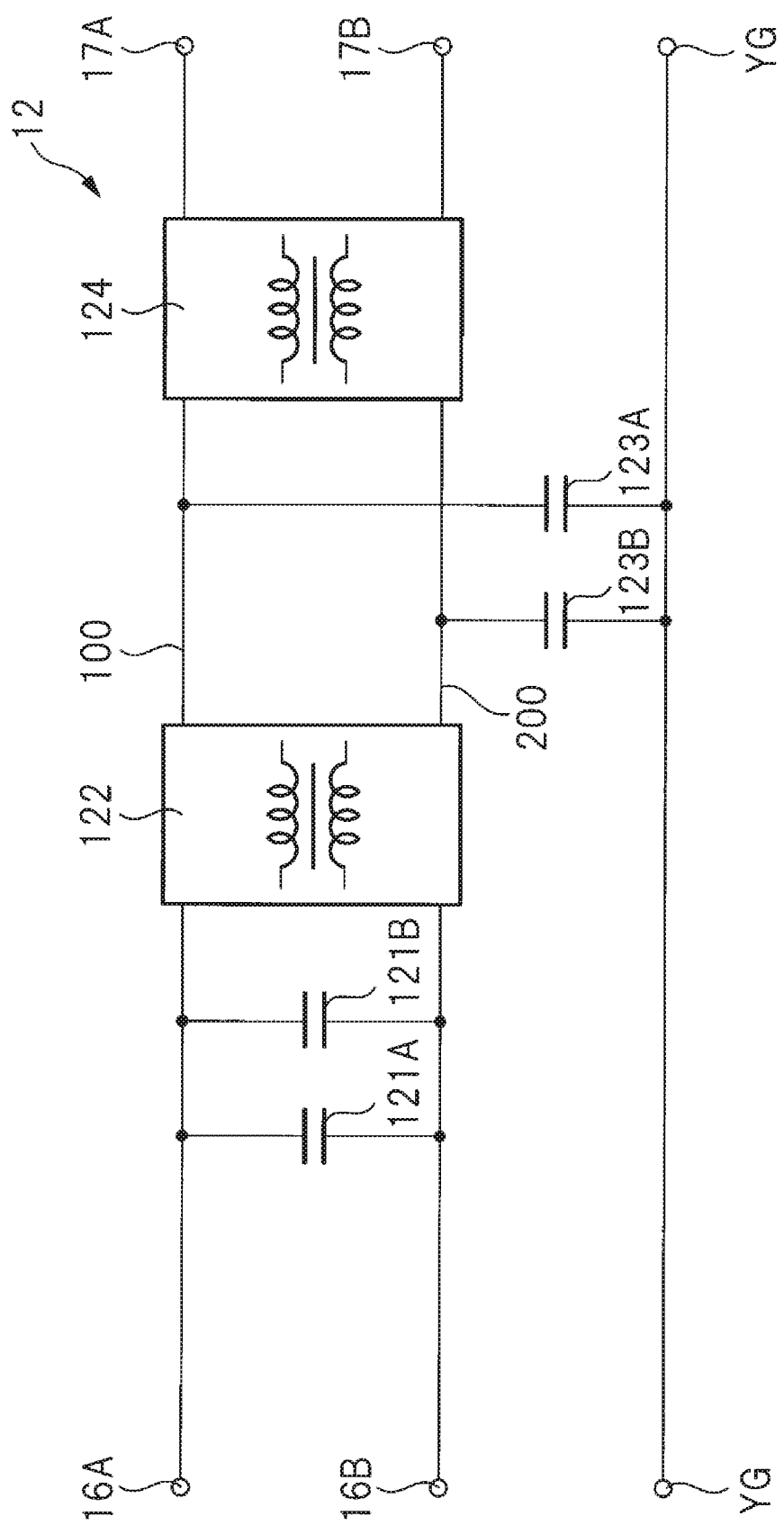
FIG. 2 is a diagram showing a circuit configuration of a voltage filter.

FIG. 2 is a diagram showing the circuit configuration of the voltage filter.

In FIG. 2, the voltage filter 12 includes the anode terminal 16A, the cathode terminal 16B, the anode terminal 17A and the cathode terminal 17B. The anode terminal 16A is electrically connected to the anode of the power source 2, and the cathode terminal 16B is electrically connected to the cathode of the power source 2 as shown in FIG. 1. The anode terminal 17A is electrically connected to the anode of the semiconductor module 14, and the cathode terminal 17B is electrically connected to the cathode of the semiconductor module 14 as shown in FIG. 1. The voltage filter 12 is provided with the ground terminal YG, and the ground terminal YG is electrically connected to the frame ground G of the housing 10 as shown in FIG. 1. Further, in the voltage filter 12, the anode terminal 16A and the anode terminal 17A are electrically connected by a wiring 100, and the cathode terminal 16B and the cathode terminal 17B are electrically connected by a wiring 200.

Next, as shown in FIG. 2, the voltage filter 12 includes an X capacitor 121A, an X capacitor 121B, a magnetic core 122, a Y capacitor 123A, a Y capacitor 123B, and a magnetic core 124. At this time, the X capacitor 121A and the X capacitor 121B, and the magnetic core 122 and the magnetic core 124 are provided between the wiring 100 and the wiring 200. On the other hand, the Y capacitor 123A is provided between the wiring 100 and the ground terminal YG, and the Y capacitor 123B is provided between the wiring 200 and the ground terminal YG.

According to the voltage filter 12 configured as described above, for example, even when a high-order harmonic generated from the semiconductor module 14 shown in FIG. 1 is superimposed between the wiring 100 and the wiring 200, the high-order harmonic can be reduced by the X capacitor 121A, the X capacitor 121B, the magnetic core 122, and the magnetic core 124 provided between the wiring 100 and the wiring 200. Further, according to the voltage filter 12, the high frequency noise superimposed between the ground terminal YG and the wiring 100 can be reduced by the Y capacitor 123A. Similarly, according to the voltage filter 12, the high frequency noise superimposed between the ground terminal YG and the wiring 200 can be reduced by the Y capacitor 123B.

<Room for Improvement Inherent in Voltage Filter>

As described above, according to the voltage filter 12, the high frequency noise superimposed between the wiring 100 and the wiring 200, or the high frequency noise superimposed between the wiring 100 and the ground terminal YG, or the high frequency noise superimposed between the wiring 200 and the ground terminal YG due to the switching operation of the semiconductor elements constituting the semiconductor module 14 can be reduced. As a result, according to the power conversion device 1 including the voltage filter 12, since the high frequency noise output from the power conversion device 1 to the cable can be reduced, it is possible to reduce the adverse effect represented by the malfunction of the electronic device (such as the ECU) disposed around the cable due to the interference waves (electromagnetic waves) emitted from the cable.

However, the rapid voltage change or the rapid current change accompanying the on/off of the semiconductor element (switching element) generates not only the high frequency noise transmitted through the wiring (electric path) but also the temporally changing magnetic field around the switching element. The inventor newly finds that the temporally changing magnetic field induces the generation of the electromagnetic induction noise from the voltage filter 12.

This point will be described below.

Figure 3:
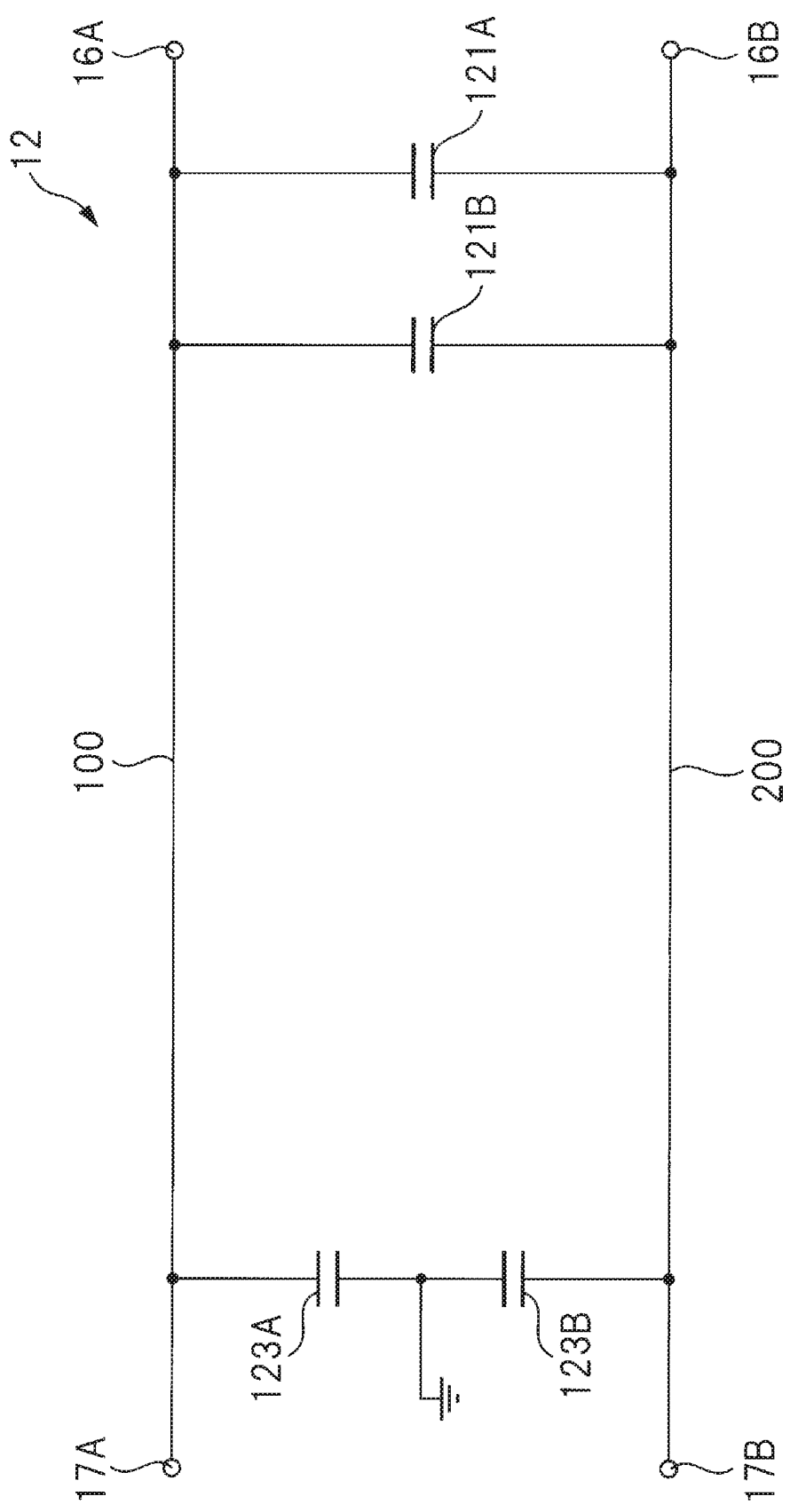
FIG. 3 is a diagram showing that a closed loop is formed in the voltage filter shown in FIG. 2.
Figure 4:
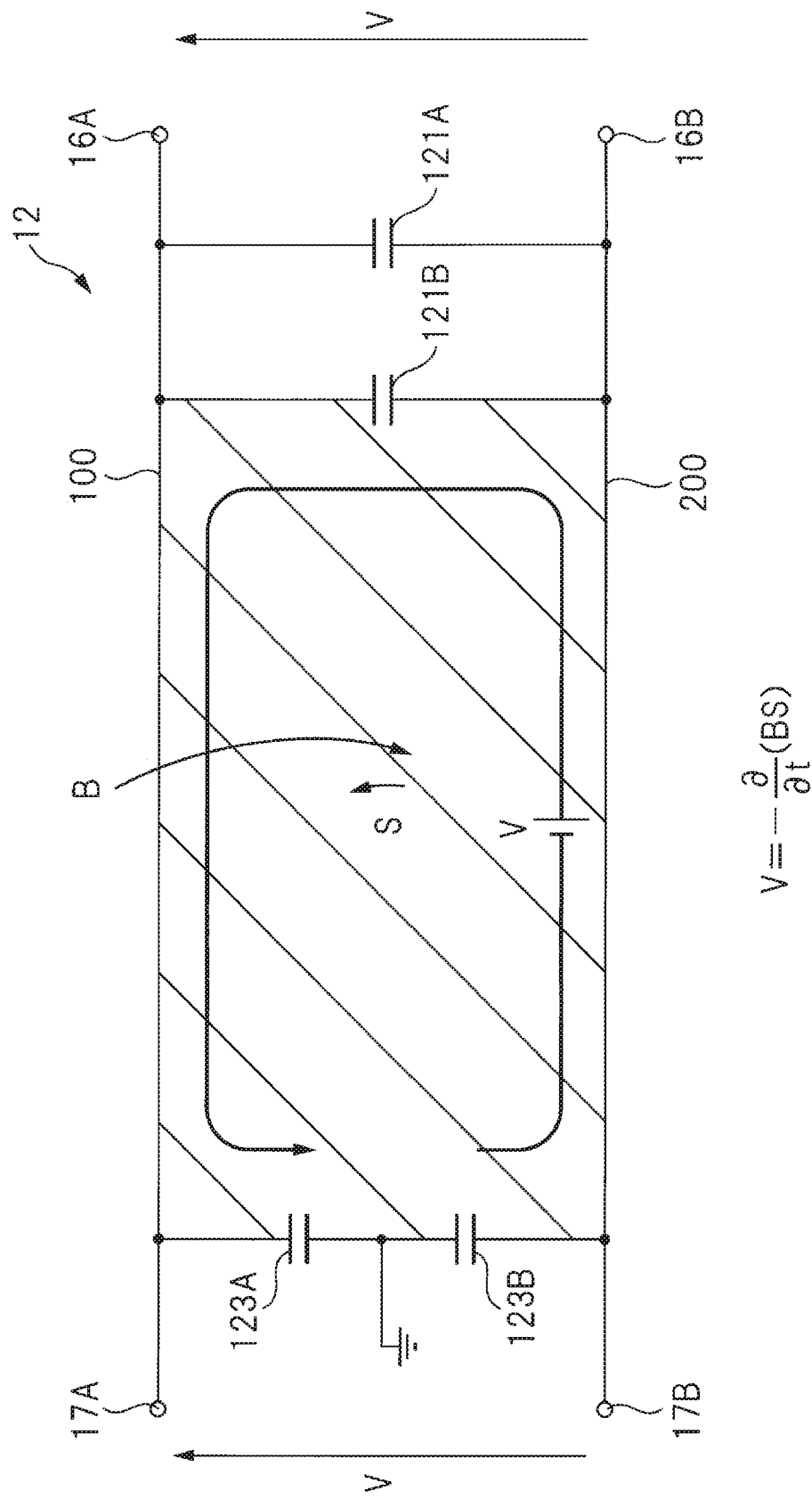
FIG. 4 is a diagram showing an induced electromotive force generated when a magnitude of a magnetic field (magnetic flux density) penetrating a region surrounded by the closed loop increases with time.

FIG. 3 is a diagram showing that a closed loop is formed in the voltage filter 12 shown in FIG. 2. As shown in FIG. 3, in the voltage filter 12, the closed loop is formed by the wiring 100, the X capacitor 121B, the wiring 200, the Y capacitor 123B, and the Y capacitor 123A. In this way, since the closed loop is formed in the voltage filter 12 shown in FIG. 3, when the temporally changing magnetic field (magnetic flux density B) penetrates the closed loop, a temporally changing induced electromotive force is generated in the closed loop. That is, since the temporally changing magnetic field (magnetic flux density B) generated around the semiconductor element due to the rapid voltage change or the rapid current change accompanying the on/off of the semiconductor element penetrates the closed loop formed in the voltage filter 12, the induced electromotive force is generated in the closed loop. Specifically, as shown in FIG. 4, an area surrounded by the closed loop is set as "S", a magnitude of the magnetic field (magnetic flux density) penetrating the closed loop is set as "B", and the direction of the magnetic field penetrating the closed loop is set as the direction of the arrow in FIG. 4. At this time, considering a case where the magnitude of the magnetic field (magnetic flux density) penetrating the region surrounded by the closed loop increases with time, an induced electromotive force is generated in the closed loop so as to cancel the increase in the magnitude of the magnetic field. On the other hand, considering a case where the magnitude of the magnetic field (magnetic flux density) penetrating the region surrounded by the closed loop decreases with time, an induced electromotive force is generated in the closed loop so as to cancel the decrease in the magnitude of the magnetic field. That is, the induced electromotive force of $V=-\partial(BS)/\partial t$ is generated in the closed loop. Here, "V" indicates the induced electromotive force generated between the anode terminal 16A (anode terminal 17A) and the cathode terminal 16B (cathode terminal 17B). In particular, FIG. 4 illustrates the induced electromotive force "V" generated when the magnitude of the magnetic field (magnetic flux density) penetrating the region surrounded by the closed loop increases with time. The induced electromotive force "V" generated when the magnitude of the magnetic field (magnetic flux density) penetrating the region surrounded by the closed loop decreases with time is opposite to the "V" shown in FIG. 4.

In this way, in the voltage filter 12, the electromagnetic induction noise (high frequency noise) based on the induced electromotive force "V" is superimposed between the wiring 100 and the wiring 200.

That is, while the voltage filter 12 is effective in reducing the high frequency noise transmitted through the wiring, the voltage filter itself becomes the generation source of the electromagnetic induction noise with the adverse effect of the changing magnetic field due to the rapid voltage change or the rapid current change accompanying the on/off of the semiconductor element. When the electromagnetic induction noise generated from the voltage filter 12 itself is superimposed on, for example, the cable which connects the power conversion device 1 with the power source 2, the electronic device disposed around the cable is adversely affected.

Hereinafter, it will be described that in the related art for realizing the voltage filter described above, it is apparent that, as a result of actually forming the closed loop, the electromagnetic induction noise is taken as the room for improvement in the voltage filter according to the related art.

Here, the "related art" in the description is a technique having a problem newly found by the inventor and is not a known related art, but is a technique described with the intention of a premise technique (unknown technique) of a new technical idea.

Figure 5:
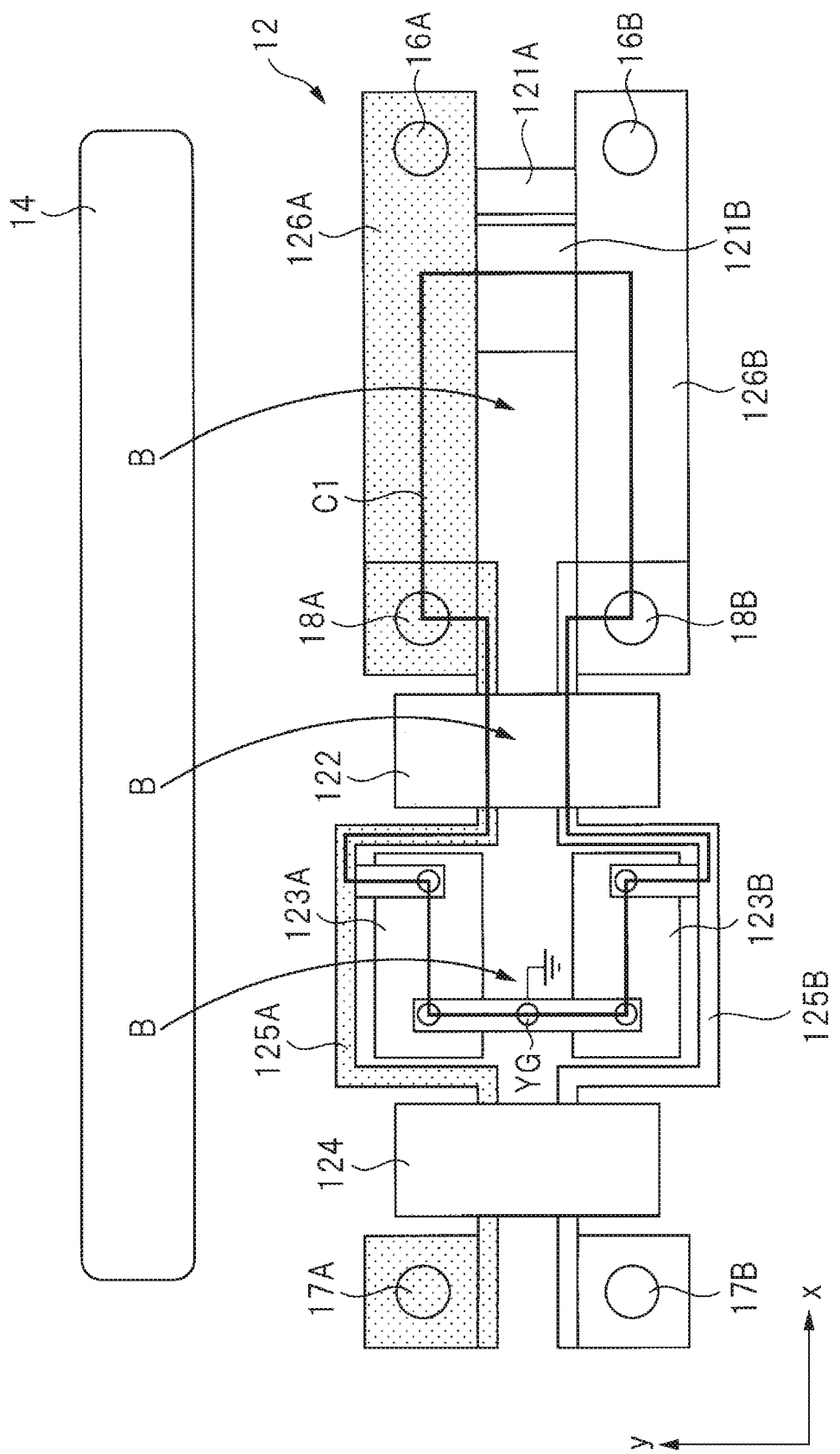
FIG. 5 is a diagram showing a mounting configuration of the voltage filter according to a related art.

FIG. 5 is a diagram showing a mounting configuration of the voltage filter according to the related art. In FIG. 5, the anode terminal 17A and the cathode terminal 17B are aligned in a y direction. The anode terminal 17A, an anode relay terminal 18A, and the anode terminal 16A are aligned in an x direction. Similarly, the cathode terminal 17B, a cathode relay terminal 18B, and the cathode terminal 16B are aligned in the x direction. At this time, as shown in FIG. 5, the anode terminal 17A and the anode relay terminal 18A are connected by a bus bar 125A made of, for example, a copper plate. The cathode terminal 17B and the cathode relay terminal 18B are connected by a bus bar 125B made of, for example, the copper plate. The magnetic core 124 and the magnetic core 122 sandwich the bus bar 125A and the bus bar 125B. Next, the bus bar 125A and the bus bar 125B are bent, and the Y capacitor 123A and the Y capacitor 123B are connected in series between the bus bar 125A and the bus bar 125B. Here, a connection point between the Y capacitor 123A and the Y capacitor 123B connected in series is electrically connected to the ground terminal YG.

Next, as shown in FIG. 5, the anode relay terminal 18A and the anode terminal 16A are connected by a bus bar 126A made of, for example, the copper plate. Similarly, the cathode relay terminal 18B and the cathode terminal 16B are connected by a bus bar 126B made of, for example, the copper plate. At this time, the X capacitor 121B and the X capacitor 121A are connected in parallel between the bus bar 126A and the bus bar 126B.

As described above, it can be seen that the voltage filter 12 having the circuit configuration shown in FIG. 2 is realized by the mounting configuration like the voltage filter 12 according to the related art shown in FIG. 5. In this case, it can be seen that, in the voltage filter 12 according to the related art, a closed loop C1 composed of a path of Y capacitor 123A→bus bar 125A→magnetic core 122→anode relay terminal 18A→bus bar 126A→X capacitor 121B→bus bar 126B→cathode relay terminal 18B→magnetic core 122→bus bar 125B→Y capacitor 123B is formed.

On the other hand, since the semiconductor module 14 which includes the semiconductor element functioning as the switching element is disposed in the vicinity of the voltage filter 12, the temporally changing magnetic field (magnetic flux density B) generated in the semiconductor module 14 adversely affects the voltage filter 12 in the related art.

Specifically, for example, as shown in FIG. 5, since the temporally changing magnetic field (magnetic flux density B) generated around the semiconductor element due to the rapid voltage change or the rapid current change accompanying the on/off of the semiconductor element included in the semiconductor module 14 penetrates the closed loop C1 formed in the voltage filter 12, the induced electromotive force is generated in the closed loop.

Accordingly, the electromagnetic induction noise due to the induced electromotive force is generated in the voltage filter 12 in the related art. The electromagnetic induction noise generated from the voltage filter 12 itself is a factor in causing the interference waves (electromagnetic waves) having an adverse effect represented by malfunction of the electronic device. Therefore, it is necessary to reduce the electromagnetic induction noise generated from the voltage filter 12 itself.

In this regard, the electromagnetic induction noise generated from the voltage filter 12 itself can be reduced by reducing the area surrounded by the closed loop formed in the voltage filter 12. This is because the induced electromotive force which causes the electromagnetic induction noise is proportional to time derivative of a magnetic flux represented by a product of the magnetic flux density penetrating the closed loop and the area surrounded by the closed loop, and in particular, the induced electromotive force is proportional to the area surrounded by the closed loop when the area surrounded by the closed loop is constant without depending on time. That is, if the area surrounded by the closed loop can be reduced, the magnitude of induced electromotive force induced by electromagnetic induction can be reduced, and as a result, the electromagnetic induction noise can be reduced.

Figure 6:
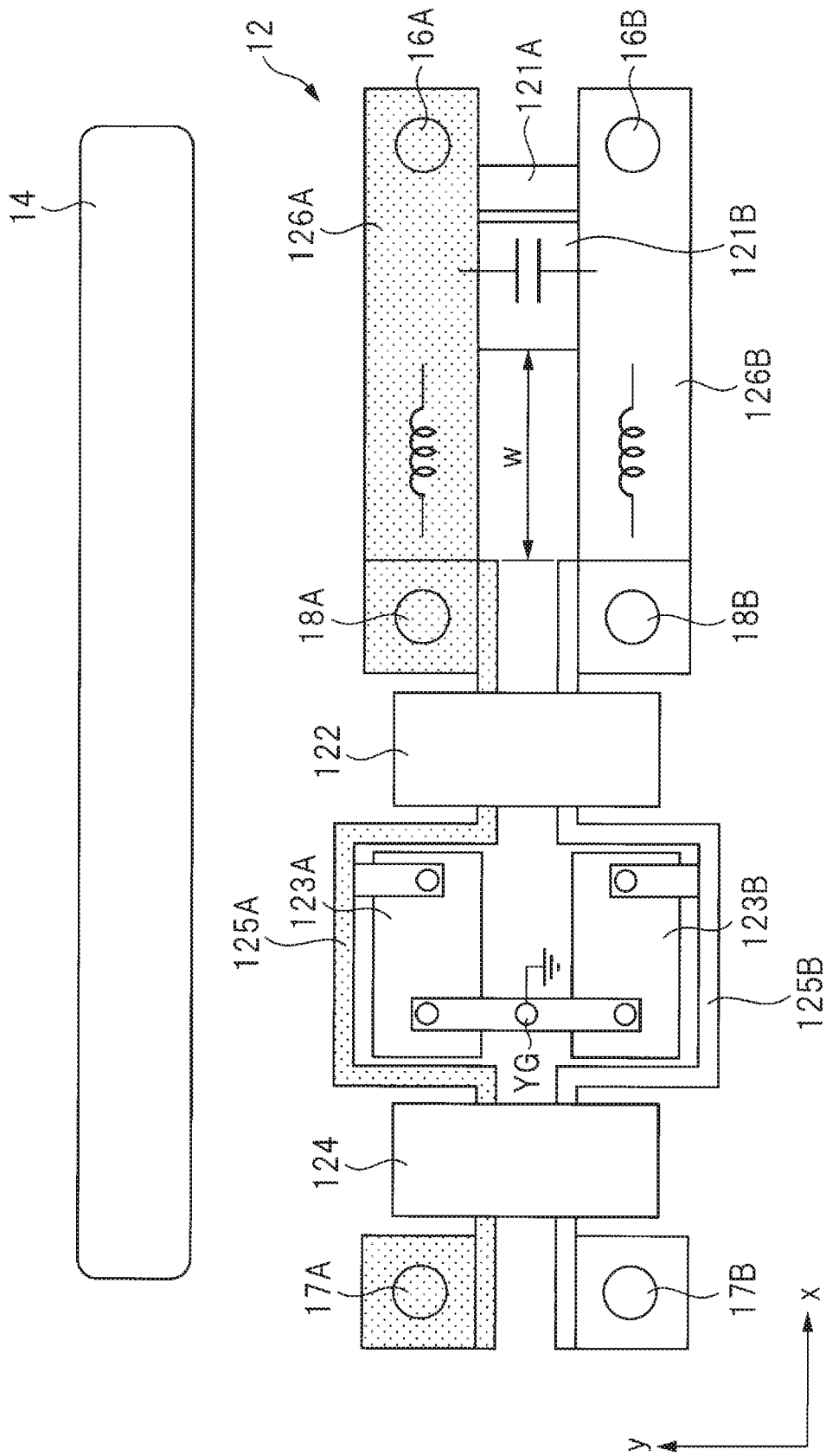
FIG. 6 is a diagram showing the necessity for a parasitic inductance in the voltage filter.

For example, in order to reduce the area surrounded by the closed loop formed in the voltage filter 12 in the related art, in FIG. 6, it can be considered to dispose the X capacitor 121B provided between the bus bar 126A and the bus bar 126B as close as possible to the anode relay terminal 18A and the cathode relay terminal 18B. That is, it is considered to make a length "W" shown in FIG. 6 as small as possible. In this case, the area surrounded by the closed loop composed of a path of Y capacitor 123A→bus bar 125A→magnetic core 122→anode relay terminal 18A→bus bar 126A→X capacitor 121B→bus bar 126B→cathode relay terminal 18B→magnetic core 122→bus bar 125B→Y capacitor 123B can be reduced.

However, in the voltage filter 12 in the related art, it is difficult to make the length "W" shown in FIG. 6 as small as possible. This is because in the related art, as shown in FIG. 6, a parasitic inductance of the bus bar 126A, a parasitic inductance of the bus bar 126B, and the X capacitor 121B constitute an "LC filter". That is, in the voltage filter 12 in the related art, the parasitic inductance of the bus bar 126A and the parasitic inductance of the bus bar 126B are used in order to form the "LC filter". For this reason, in the voltage filter 12 in the related art, it is difficult to make the length "W" shown in FIG. 6 as small as possible. This is because reducing the length "W" shown in FIG. 6 as much as possible means that the parasitic inductance of the bus bar 126A and the parasitic inductance of the bus bar 126B are reduced. In this case, it is difficult to use the parasitic inductance of the bus bar 126A and the parasitic inductance of the bus bar 126B in order to form the "LC filter". Therefore, in the voltage filter 12 in the related art, it is necessary to secure the length "W" shown in FIG. 6, and as a result, the area surrounded by the closed loop inevitably increases. As described above, in the voltage filter 12 in the related art, the approach of reducing the magnitude of the induced electromotive force induced by electromagnetic induction, and reducing the electromagnetic induction noise by reducing the area surrounded by the closed loop cannot be adopted.

Therefore, in order to reduce the electromagnetic induction noise generated from the voltage filter 12 itself due to the temporally changing magnetic field (magnetic flux density B) generated in the semiconductor module 14, it is necessary to consider an approach different from the approach of reducing the area surrounded by the closed loop formed in the voltage filter 12.

Therefore, in the present embodiment, by adopting an approach different from the approach of reducing the area surrounded by the closed loop formed in the voltage filter 12, a device is provided to reduce the electromagnetic induction noise generated from the voltage filter 12 itself. In the following, the technical idea of the present embodiment which employs the device will be described.

<Basic Idea in Embodiment>

Figure 7:
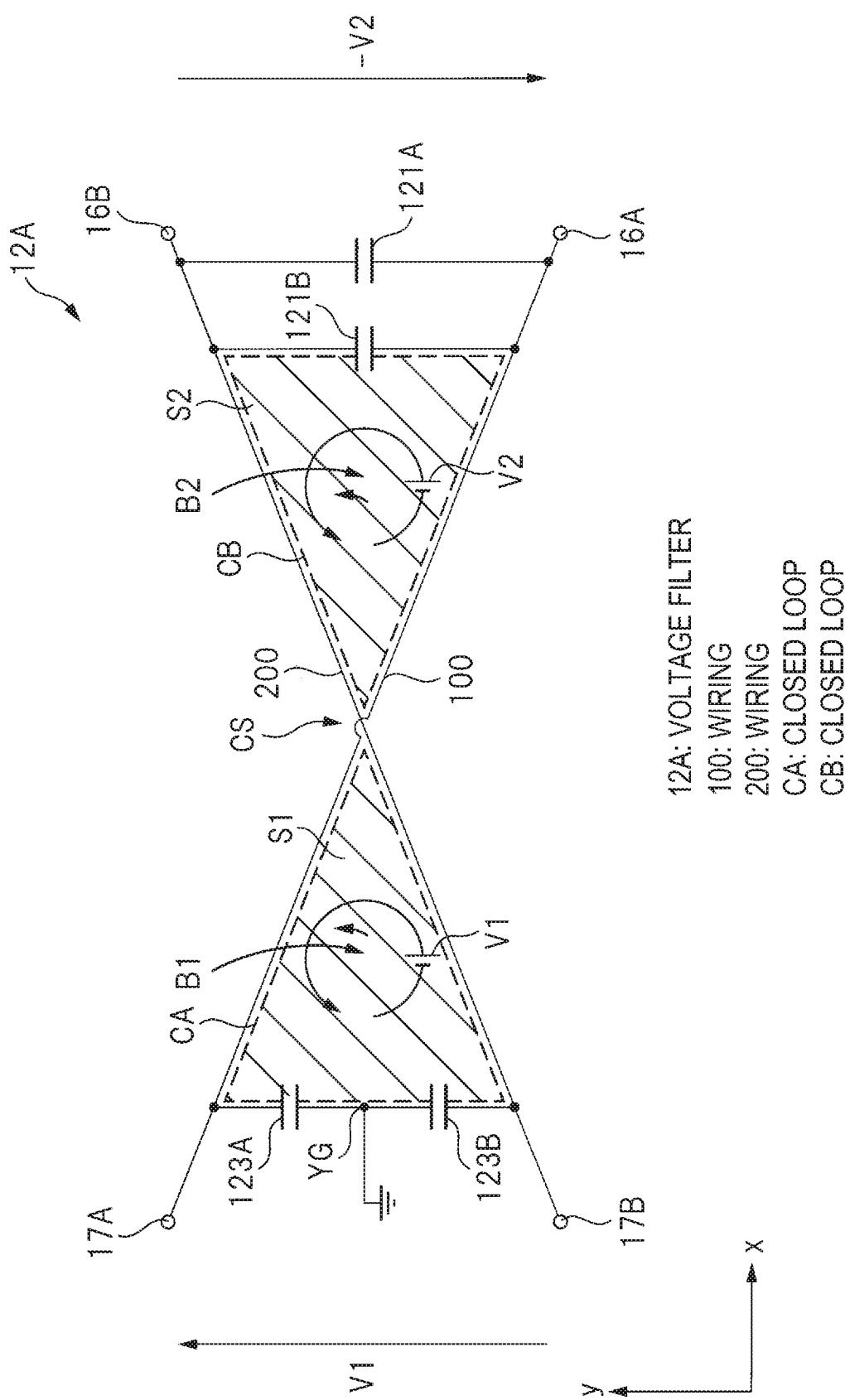
FIG. 7 is a diagram showing a schematic configuration of the voltage filter according to the embodiment.

FIG. 7 is a diagram showing a schematic configuration of the voltage filter according to the present embodiment.

In FIG. 7, a voltage filter 12A according to the present embodiment includes the anode terminal 17A and the cathode terminal 17B aligned in the y direction. The voltage filter 12A includes the cathode terminal 16B which is aligned with the anode terminal 17A in the x direction, and the anode terminal 16A which is aligned with the cathode terminal 17B in the x direction. At this time, the anode terminal 17A and the anode terminal 16A are electrically connected by the wiring 100. On the other hand, the cathode terminal 17B and the cathode terminal 16B are electrically connected by the wiring 200.

Further, the voltage filter 12A includes the X capacitor 121A and the X capacitor 121B connected in parallel between the wiring 100 and the wiring 200, and the Y capacitor 123A and the Y capacitor 123B connected in series between the wiring 100 and the wiring 200.

Here, as shown in FIG. 7, the wiring 100 and the wiring 200 intersect at an intersection CS. The X capacitor 121A and the X capacitor 121B connected in parallel are disposed on a right side of the intersection CS, and the Y capacitor 123A and the Y capacitor 123B connected in series are disposed on a left side of the intersection CS. That is, the X capacitor 121A and the X capacitor 121B connected in parallel and the Y capacitor 123A and the Y capacitor 123B connected in series are provided at positions where the intersection CS is sandwiched therebetween. A connection portion between the Y capacitor 123A and the Y capacitor 123B connected in series between the wiring 100 and the wiring 200 is connected to the ground terminal YG. In other words, the connection portion between the Y capacitor 123A and the Y capacitor 123B is grounded.

In the voltage filter 12A configured as described above, the X capacitor 121A and the X capacitor 121B have a function of smoothing noise superimposed between the wiring 100 and the wiring 200. On the other hand, the Y capacitor 123A has a function of smoothing noise superimposed between the wiring 100 and a ground, and the Y capacitor 123B has a function of smoothing noise superimposed between the wiring 200 and the ground.

Here, according to the basic idea in the present embodiment, rather than reducing the area of the region surrounded by the closed loop formed in the voltage filter 12A, an induced electromotive force generated in the voltage filter 12A itself is reduced by forming a pair of closed loops in which the directions of the generated induced electromotive forces are opposite to each other by making an anode wiring intersect a cathode wiring.

Specifically, as shown in FIG. 7, according to the basic idea in the present embodiment, the wiring 100 which connects the anode terminal 17A with the anode terminal 16A intersects with the wiring 200 which connects the cathode terminal 17B with the cathode terminal 16B. Accordingly, as shown in FIG. 7, a closed loop CA is formed by the Y capacitor 123A, the Y capacitor 123B, the wiring 200, the wiring 100, and the intersection CS, and a closed loop CB is formed by the wiring 100, the X capacitor 121B, the wiring 200, and the intersection CS. At this time, when the basic idea of the present embodiment is adopted, the direction of the induced electromotive force generated due to the closed loop CA is opposite to the direction of the induced electromotive force generated due to the closed loop CB. Accordingly, according to the voltage filter 12A incorporating the basic idea in the present embodiment, the magnitude of the induced electromotive force generated in the voltage filter 12A itself can be reduced. As a result, according to the present embodiment, electromagnetic induction noise due to the induced electromotive force generated in the voltage filter 12A itself can be reduced.

Specifically, in the following, it will be described that the electromagnetic induction noise due to the voltage filter 12A can be reduced by adopting the basic idea of the present embodiment.

First, in FIG. 7, the magnitude of the magnetic field (magnetic flux density) penetrating the closed loop CA is set as "B1", the direction of the magnetic field is set as the direction of the arrow in FIG. 7, and the area of the region surrounded by the closed loop CA is set as "S1". On the other hand, in FIG. 7, the magnitude of the magnetic field (magnetic flux density) penetrating the closed loop CB is set as "B2", the direction of the magnetic field is set as the direction of the arrow in FIG. 7, and the area of the region surrounded by the closed loop CB is set as "S2". In the following, for example, considering that the closed loop CA and the closed loop CB are close to each other, it is assumed that time dependency of the magnetic field (magnetic flux density "B1") penetrating the closed loop CA is equal to time dependency of the magnetic field (magnetic flux density "B2") penetrating the closed loop CB. Therefore, as an example, a case where the magnetic field (magnetic flux density "B1") penetrating the closed loop CA increases with time, and the magnetic field (magnetic flux density "B2") penetrating the closed loop CB increases with time is considered. In this case, an induced electromotive force is generated in the closed loop CA so as to cancel the increase in the magnitude of the magnetic field (magnetic flux density "B1"), and an induced electromotive force is generated in the closed loop CB so as to cancel the increase in the magnitude of the magnetic field (magnetic flux density "B2").

Focusing on the closed loop CA, an induced electromotive force of "V1" is generated between the anode terminal 17A and the cathode terminal 17B with reference to the cathode terminal 17B. On the other hand, focusing on the closed loop CB, an induced electromotive force of "−V2" is generated between the anode terminal 16A and the cathode terminal 16B with reference to the cathode terminal 16B. At this time, as shown in FIG. 7, when the basic idea in the present embodiment of intersecting the wiring 100 which connects the anode terminal 17A with the anode terminal 16A and the wiring 200 which connects the cathode terminal 17B with the cathode terminal 16B is adopted, the induced electromotive force "V1" due to the closed loop CA and the induced electromotive force "−V2" due to the closed loop CB between the wiring 100 with the wiring 200 are generated. Therefore, the induced electromotive force generated between the wiring 100 and the wiring 200 is "V1"–"V2", and the magnitude of the induced electromotive force generated between the wiring 100 and the wiring 200 is reduced.

In this way, according to the basic idea of the present embodiment, it can be seen that since the magnitude of the induced electromotive force generated in the voltage filter 12 can be reduced, the electromagnetic induction noise generated from the voltage filter 12 itself can be reduced.

Here, although the induced electromotive force generated between the wiring 100 and the wiring 200 is "V1"–"V2", and in particular, when the relationship "V1"="V2" is established, the induced electromotive force generated between the wiring 100 and the wiring 200 is completely cancelled out.

This condition is established when a magnetic flux (magnetic flux density "B1"×area "S1") penetrating the closed loop CA is equal to a magnetic flux (magnetic flux density "B2"×area "S2") penetrating the closed loop CB. Therefore, from the viewpoint of reducing the induced electromotive force generated in the voltage filter 12A itself, it is desirable to design the area "S1" of the region surrounded by the closed loop CA and the area "S2" of the region surrounded by the closed loop CB to make the magnetic flux penetrating the closed loop CA be equal to the magnetic flux penetrating the closed loop CB.

<Mounting Configuration of Voltage Filter in Embodiment>

Next, the mounting configuration of the voltage filter which is realized by the above basic idea according to the present embodiment will be described.

Figure 8:
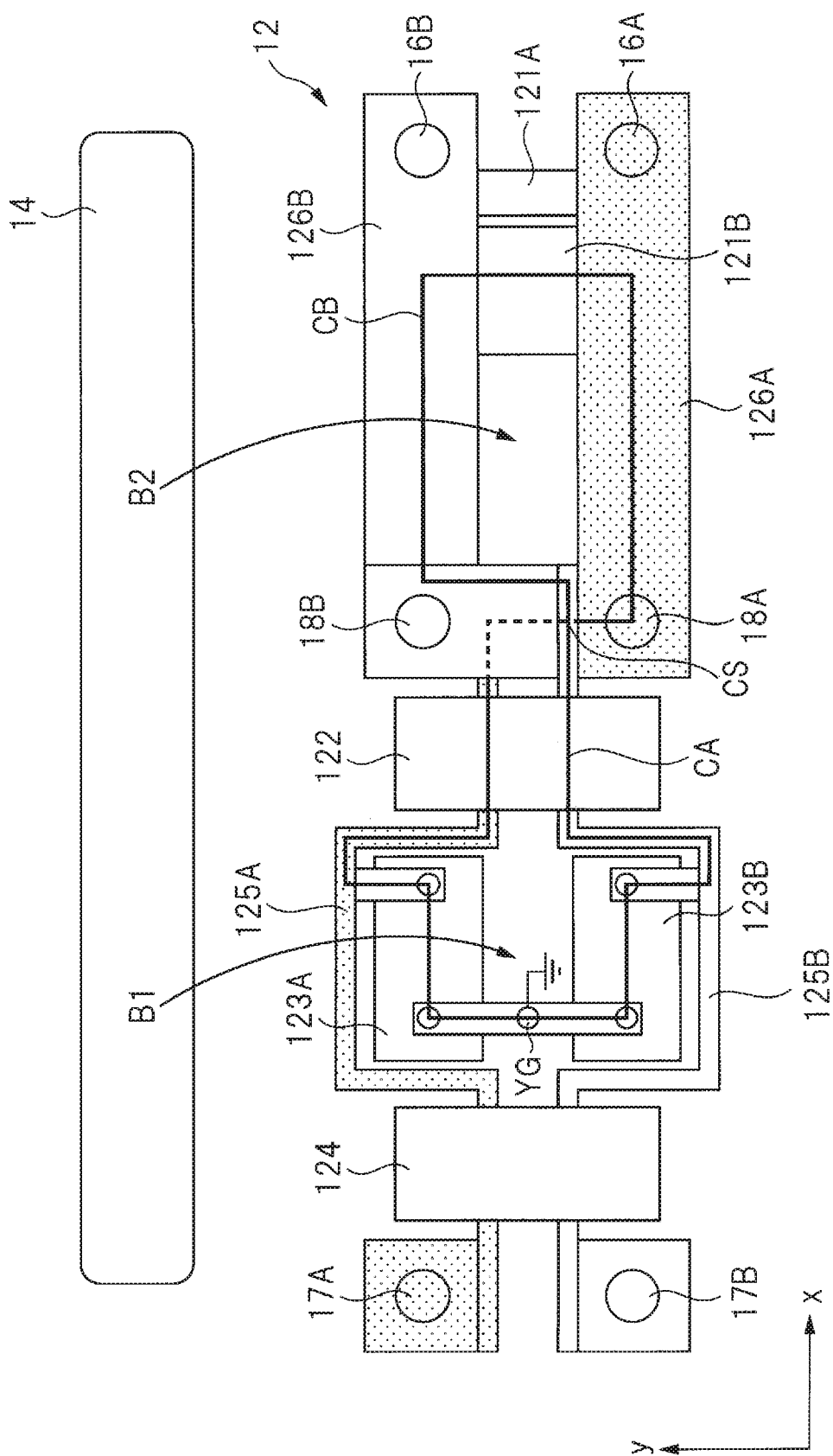
FIG. 8 is a diagram showing a mounting configuration of the voltage filter according to the embodiment.

FIG. 8 is a diagram showing the mounting configuration of the voltage filter according to the present embodiment.

In FIG. 8, the voltage filter 12A according to the present embodiment includes the anode terminal 17A and the cathode terminal 17B aligned in the y direction. The voltage filter 12A includes the anode relay terminal 18A electrically connected to the anode terminal 17A and the cathode relay terminal 18B electrically connected to the cathode terminal 17B. In particular, the anode relay terminal 18A is electrically connected to the anode terminal 17A via the bus bar 125A, and the cathode relay terminal 18B is electrically connected to the cathode terminal 17B via the bus bar 125B.

The anode relay terminal 18A and the cathode relay terminal 18B are aligned in the y direction. Further, the anode relay terminal 18A is aligned with the cathode terminal 17B in the x direction, and the cathode relay terminal 18B is aligned with the anode terminal 17A in the x direction.

Next, as shown in FIG. 8, the voltage filter 12A includes the anode terminal 16A electrically connected to the anode relay terminal 18A and the cathode terminal 16B electrically connected to the cathode relay terminal 18B. In particular, the anode terminal 16A is electrically connected to the anode relay terminal 18A via the bus bar 126A, and the cathode terminal 16B is electrically connected to the cathode relay terminal 18B via the bus bar 126B.

The anode terminal 16A and the cathode terminal 16B are aligned in the y direction. Further, the anode terminal 16A is aligned with the cathode terminal 17B and the anode relay terminal 18A in the x direction, and the cathode terminal 16B is aligned with the anode terminal 17A and the cathode relay terminal 18B in the x direction.

Next, the voltage filter 12A includes the X capacitor 121A and the X capacitor 121B which are electrically connected between the bus bar 126A and the bus bar 126B. That is, the voltage filter 12 according to the present embodiment includes the X capacitor 121A and the X capacitor 121B connected in parallel between the bus bar 126A and the bus bar 126B.

Each of the X capacitor 121A and the X capacitor 121B has a function of smoothing the voltage change (noise) superimposed on the DC voltage between the bus bar 126A and the bus bar 126B. An electrostatic capacitance of each of the X capacitor 121A and the X capacitor 121B is not particularly limited, but may be determined by a frequency band in which noise is reduced, and the X capacitor 121A and the X capacitor 121B include, for example, capacitors with the electrostatic capacitance of several nanofarads to several microfarads.

Figure 9:
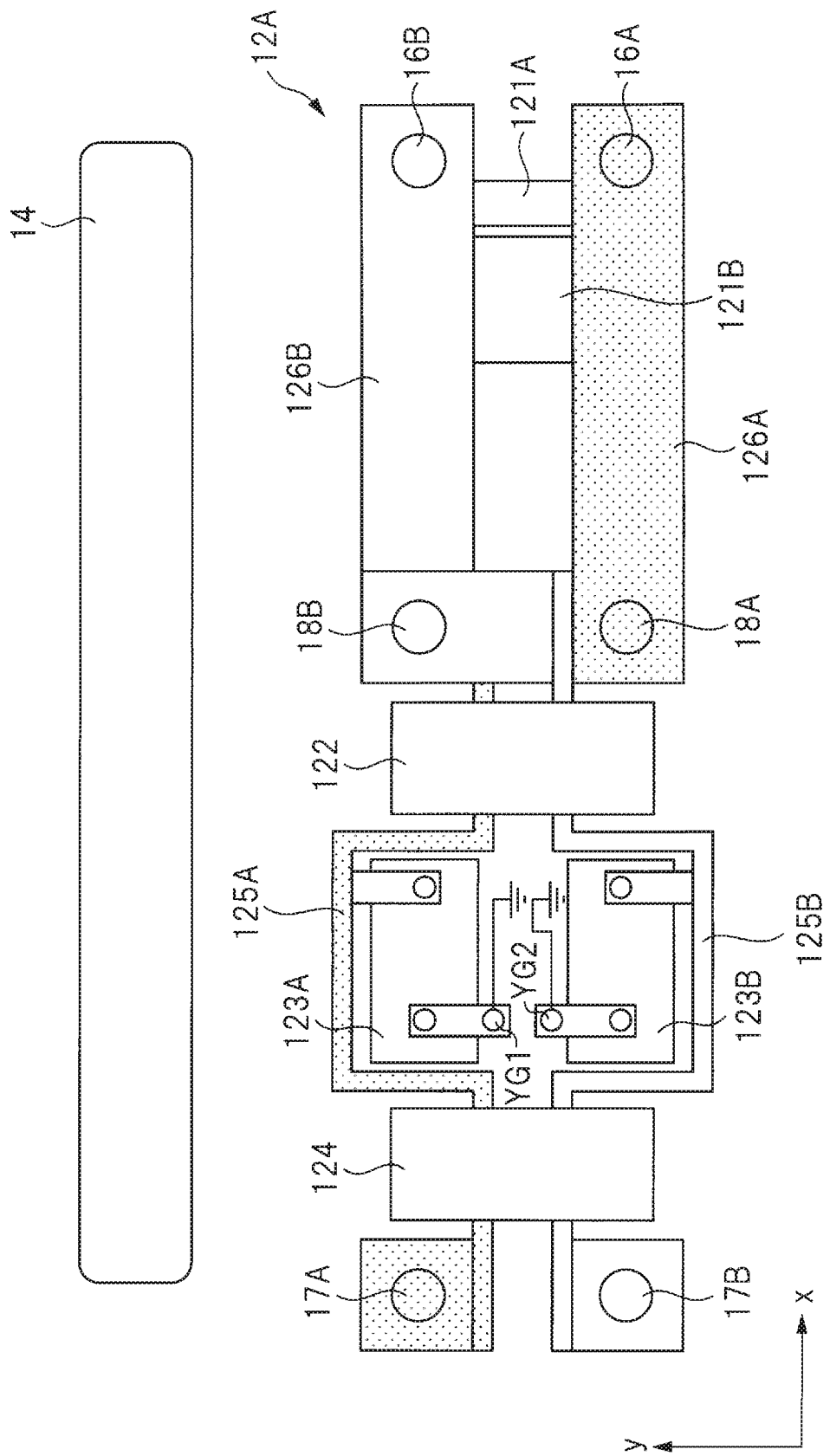
FIG. 9 is a diagram showing a mounting configuration of the voltage filter according to a modification.

The voltage filter 12A in the present embodiment includes the Y capacitor 123A and the Y capacitor 123B connected in series between the bus bar 125A and the bus bar 125B. At this time, as shown in FIG. 8, the connection point between the Y capacitor 123A and the Y capacitor 123B is electrically connected to the ground terminal YG. That is, the connection point between the Y capacitor 123A and the Y capacitor 123B is grounded. At this time, as shown in FIG. 8, the Y capacitor 123A and the Y capacitor 123B are electrically connected to the common ground terminal YG, but the configuration is not limited thereto. For example, as shown in FIG. 9, a ground terminal YG1 to which the Y capacitor 123A is electrically connected and a ground terminal YG2 to which the Y capacitor 123B is electrically connected may be different terminals.

While the Y capacitor 123A has a function of smoothing the voltage change (noise) superimposed between the bus bar 125A and the ground, the Y capacitor 123B has a function of smoothing the voltage change (noise) superimposed between the ground and the bus bar 125B. An electrostatic capacitance of each of the Y capacitor 123A and the Y capacitor 123B is not particularly limited, but may be determined by a frequency band in which noise is reduced, and the Y capacitor 123A and the Y capacitor 123B include, for example, capacitors with the electrostatic capacitance of several nanofarads to several microfarads.

Here, as shown in FIG. 8, in the voltage filter 12A according to the present embodiment, the bus bar 125A is bent so as to be connected to both the anode terminal 17A and the anode relay terminal 18A which are shifted in the y direction. Similarly, in the voltage filter 12A according to the present embodiment, the bus bar 125B is bent so as to be connected to both the cathode terminal 17B and the cathode relay terminal 18B which are shifted in the y direction. As a result, as shown in FIG. 8, the bus bar 125A intersects with the bus bar 125B three-dimensionally. That is, the bus bar 125A and the bus bar 125B are three-dimensionally disposed so as not to be in electrical contact at the intersection CS. As shown in FIG. 8, in the voltage filter 12A according to the present embodiment, the X capacitor 121A and the X capacitor 121B are provided on the right side of the intersection CS, and the Y capacitor 123A and the Y capacitor 123B are provided on the left side of the intersection CS. On the left side of the intersection CS, the magnetic core 122 and the magnetic core 124 are disposed so as to sandwich the Y capacitor 123A and the Y capacitor 123B.

Accordingly, in the voltage filter 12A according to the present embodiment, the closed loop CA composed of a path of Y capacitor 123A→bus bar 125A→intersection CS→bus bar 125B→Y capacitor 123B is formed, and the closed loop CB composed of a path of X capacitor 121B→bus bar 126B→cathode relay terminal 18B→bus bar 125B→intersection CS→bus bar 125A→anode relay terminal 18A→bus bar 126A is formed.

In this way, according to the mounting configuration of the voltage filter 12A shown in FIG. 8, the schematic configuration of the voltage filter 12A shown in FIG. 7 is realized. As a result, according to the mounting configuration (FIG. 8) of the voltage filter 12A in the present embodiment, the magnitude of the induced electromotive force generated in the voltage filter 12 can be reduced by the mechanism described in the basic idea column in the present embodiment. Therefore, the electromagnetic induction noise generated from the voltage filter 12 itself can be reduced.

Also in the voltage filter 12A shown in FIG. 8, the LC filter is configured using the parasitic inductance of the bus bar 126A, the parasitic inductance of the bus bar 126B, the electrostatic capacitance of the X capacitor 121A, and the electrostatic capacitance of the X capacitor 121B.

<Effect of Embodiment>

Next, the effect of the present embodiment will be described.

For example, in FIG. 8, a DC bus bar (not shown) and the semiconductor module 14 are disposed in the vicinity of the voltage filter 12A. The semiconductor module 14 includes, for example, the semiconductor element (power transistor) which is the switching element that constitutes the inverter. A noise current flows through the DC bus bar and the semiconductor module 14, and the temporally changing magnetic field (magnetic flux density) is generated from the noise current. The temporally changing magnetic field (magnetic flux density) generated from the semiconductor module 14 may adversely affect the voltage filter 12A disposed in the vicinity of the semiconductor module 14.

In this regard, for example, in the voltage filter 12 in the related art as shown in FIG. 5, a part of the temporally changing magnetic field penetrates the closed loop C1. As a result, the electromagnetic induction noise (noise voltage) is generated due to the induced electromotive force generated in the closed loop C1. When the power conversion device is mounted on the electric vehicle, since the electromagnetic induction noise has, for example, a magnetic field strength of 120 dBuA/m (1 MHz, measured value) in the housing, the electromagnetic induction noise induced in the closed loop C1 of 10 mm×10 mm is about 80 dBuV. The value of the electromagnetic induction noise is about the same degree as a specified value of high voltage noise and cannot be ignored. That is, in the voltage filter 12 in the related art as shown in FIG. 5, the electromagnetic induction noise generated from the voltage filter 12 itself becomes obvious. Therefore, for example, in the related art as shown in FIG. 5, in order not to be affected by the temporally changing magnetic field generated from the semiconductor module 14 or the like, it is necessary to cover the voltage filter 12 with a magnetic shielding material of a metal plate or the like. However, when the voltage filter 12 is covered with a magnetic shield, there is a problem that the manufacturing cost increases as much as the magnetic shield is used.

On the other hand, for example, in the voltage filter 12A according to the present embodiment as shown in FIG. 8, by intersecting the bus bar 125A with the bus bar 125B at the intersection CS, the electromagnetic induction noise generated in the closed loop CA and the electromagnetic induction noise generated in the closed loop CB are in opposite phases, and as a result, the electromagnetic induction noise generated in the closed loop CA and the electromagnetic induction noise generated in the closed loop CB cancel each other out. Accordingly, the electromagnetic induction noise generated from the voltage filter 12A itself can be reduced. In particular, when the area of the region surrounded by the closed loop CA and the area of the region surrounded by the closed loop CB are set such that the magnetic flux penetrating the closed loop CA and the magnetic flux penetrating the closed loop CB are approximately the same, the electromagnetic induction noise cancels each other out, and as a result, the electromagnetic induction noise generated from the voltage filter 12A itself can be greatly reduced.

Accordingly, for example, in the voltage filter 12A according to the present embodiment as shown in FIG. 8, even without using the magnetic shield which covers the voltage filter 12A, the electromagnetic induction noise generated from the voltage filter 12A itself can be reduced. This means that according to the voltage filter 12A in the present embodiment, it is not necessary to use the magnetic shield in order to reduce the electromagnetic induction noise. Accordingly, there is a remarkable effect that the manufacturing cost of the power conversion device which includes the voltage filter 12A can be reduced.

In the following, it will be described that, according to the voltage filter 12A in the present embodiment, the electromagnetic induction noise (noise voltage) can be reduced using an electromagnetic field simulator as compared with the voltage filter 12 in the related art.

Figure 10:
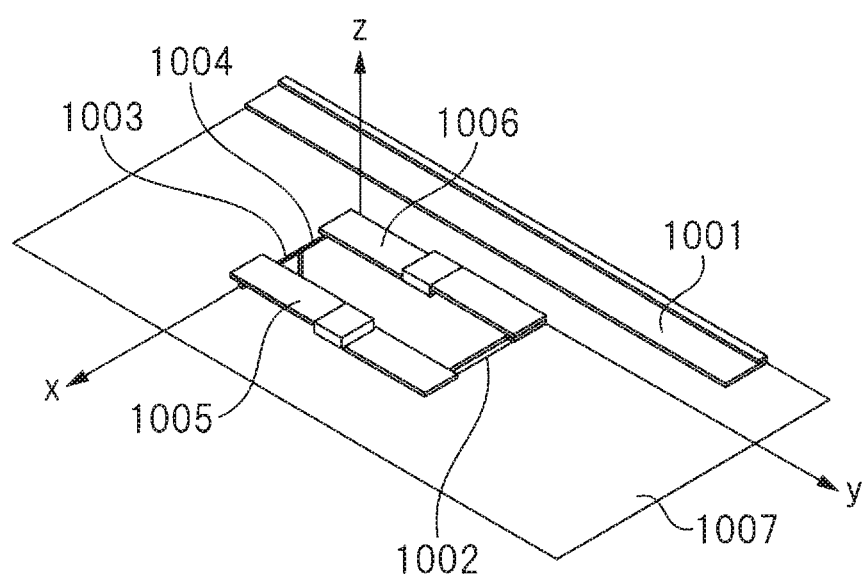
FIG. 10 is a diagram showing an example of a calculation model for calculating a noise voltage (electromagnetic induction noise) by an electromagnetic field simulator according to the related art.

FIG. 10 is a diagram showing an example of a calculation model for calculating a noise voltage (electromagnetic induction noise) by an electromagnetic field simulator according to the related art. In FIG. 10, the calculation model includes a wiring 1001 serving as a noise source, a capacitor 1002 corresponding to an X capacitor, a capacitor 1003 and a capacitor 1004 corresponding to a pair of Y capacitors connected in series, an anode bus bar 1005, a cathode bus bar 1006, and a ground plane 1007. With the electromagnetic field simulator, a voltage (noise voltage) between the anode bus bar 1005 and the cathode bus bar 1006 is calculated using the calculation model.

Figure 11:
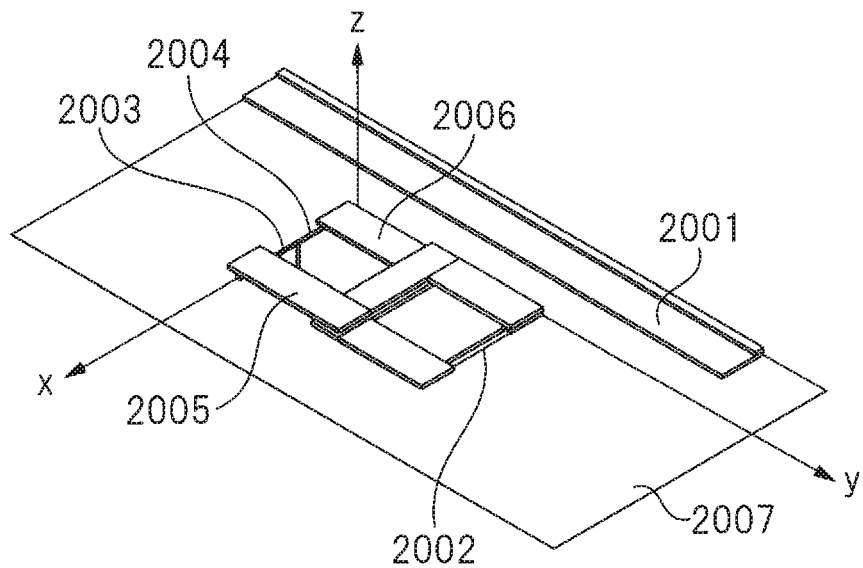
FIG. 11 is a diagram showing an example of a calculation model for calculating the noise voltage (electromagnetic induction noise) by an electromagnetic field simulator according to the present embodiment.

FIG. 11 is a diagram showing an example of a calculation model for calculating the noise voltage (electromagnetic induction noise) by the electromagnetic field simulator according to the present embodiment. In FIG. 11, the calculation model includes a wiring 2001 serving as the noise source, a capacitor 2002 corresponding to the X capacitor, a capacitor 2003 and a capacitor 2004 corresponding to the pair of Y capacitors connected in series, an anode bus bar 2005, a cathode bus bar 2006, and a ground plane 2007. Here, in the calculation model shown in FIG. 11, unlike the calculation model shown in FIG. 10, the anode bus bar 2005 intersects with the cathode bus bar 2006. With the electromagnetic field simulator, the voltage (noise voltage) between the anode bus bar 2005 and the cathode bus bar 2006 is calculated using the calculation model.

Figure 12:
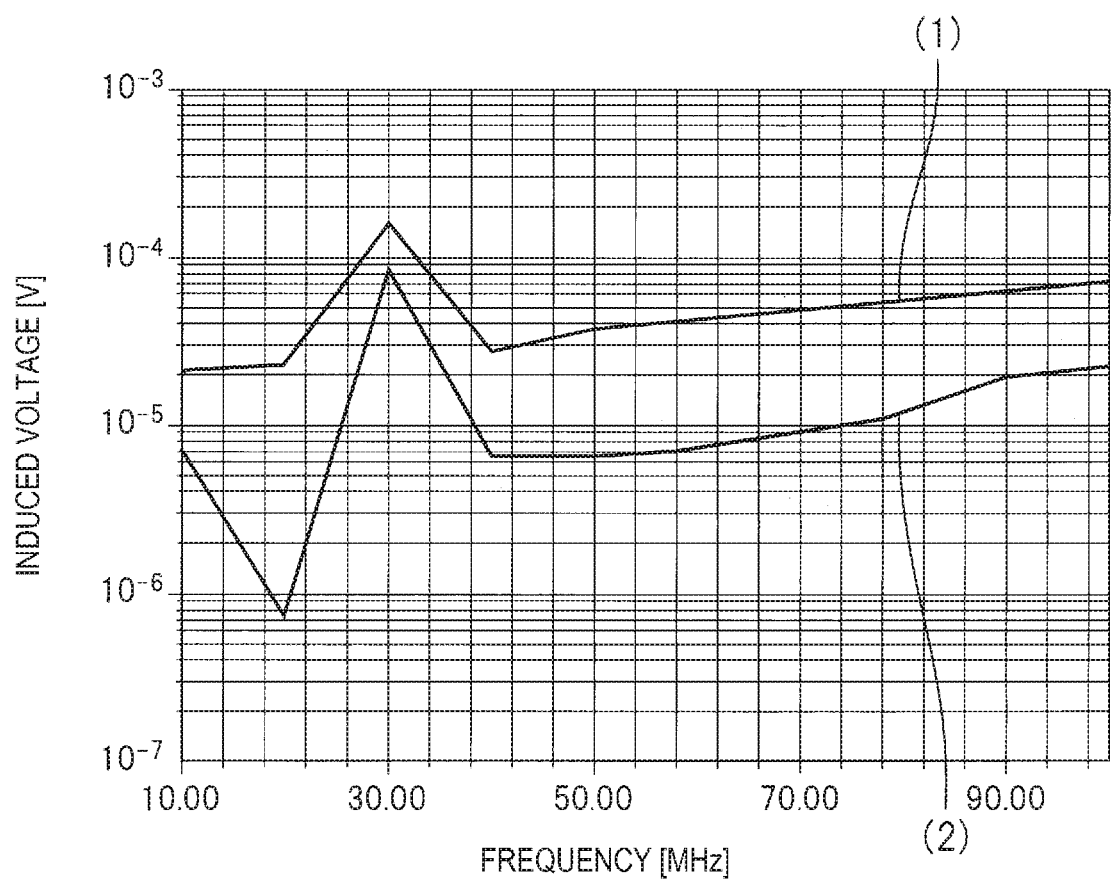
FIG. 12 is a graph showing a calculation result using the calculation model (corresponding to the related art) shown in FIG. 10 and a calculation result using the calculation model (corresponding to the embodiment) shown in FIG. 11.

FIG. 12 is a graph showing a calculation result using the calculation model (corresponding to the related art) shown in FIG. 10 and a calculation result using the calculation model (corresponding to the embodiment) shown in FIG. 11. In FIG. 12, a horizontal axis indicates a frequency (MHz), and a vertical axis indicates an induced voltage (V). In FIG. 12, graph (1) corresponds to the related art, while graph (2) corresponds to the embodiment. As shown in FIG. 12, it can be seen that the induced voltage shown in the graph (2) corresponding to the present embodiment is ¼ or less of the induced voltage shown in the graph (1) corresponding to the related art. Therefore, from the simulation result, it can be confirmed that the voltage filter 12A in the present embodiment has an effect of reducing the noise voltage (electromagnetic induction noise) by about one digit compared with the voltage filter 12 in the related art.

As mentioned above, the invention made by the inventor is specifically described based on the embodiment, but the invention is not limited to the embodiment, and it goes without saying that various changes can be made without departing from the scope of the invention.

What is claimed is:

1. A voltage filter comprising:
   a first cathode terminal and a first anode terminal aligned in a second direction orthogonal to a first direction;
   a first cathode relay terminal which is electrically connected to the first cathode terminal via a first cathode wiring and aligned with the first anode terminal in the first direction;
   a first anode relay terminal which is electrically connected to the first anode terminal via a first anode wiring and aligned with the first cathode terminal in the first direction;

a second cathode terminal which is electrically connected to the first cathode relay terminal via a second cathode wiring and aligned with the first cathode relay terminal in the first direction;

a second anode terminal which is electrically connected to the first anode relay terminal via a second anode wiring, and aligned with the first anode relay terminal in the first direction;

a first capacitive element which is electrically connected between the second cathode wiring and the second anode wiring; and a second capacitive element and a third capacitive element which are connected in series between the first cathode wiring and the first anode wiring, wherein the first cathode wiring and the first anode wiring intersect at an intersection, the second capacitive element is provided closer to a side of the first cathode terminal than the intersection, and the third capacitive element is also provided closer to a side of the first anode terminal than the intersection.

2. The voltage filter according to claim 1, wherein the second cathode wiring is composed of a cathode bus bar, and the second anode wiring is composed of an anode bus bar.

3. The voltage filter according to claim 2 further comprising:

an LC filter, wherein the LC filter includes a parasitic inductance included in the second cathode wiring;

a parasitic inductance included in the second anode wiring; and a capacitance of the first capacitive element.

4. A power conversion device, comprising:

an inverter configured to generate an AC voltage from a DC voltage for driving a motor;

a control unit configured to control the inverter; and a voltage filter configured to be electrically connected to the inverter, wherein the voltage filter includes a first cathode terminal and a first anode terminal aligned in a second direction orthogonal to a first direction;

a first cathode relay terminal which is electrically connected to the first cathode terminal via a first cathode wiring and aligned with the first anode terminal in the first direction;

a first anode relay terminal which is electrically connected to the first anode terminal via a first anode wiring and aligned with the first cathode terminal in the first direction;

a second cathode terminal which is electrically connected to the first cathode relay terminal via a second cathode wiring and aligned with the first cathode relay terminal in the first direction;

a second anode terminal which is electrically connected to the first anode relay terminal via a second anode wiring, and aligned with the first anode relay terminal in the first direction;

a first capacitive element which is electrically connected between the second cathode wiring and the second anode wiring; and a second capacitive element and a third capacitive element which are connected in series between the first cathode wiring and the first anode wiring, wherein the first cathode wiring and the first anode wiring intersect at an intersection, the second capacitive element is provided closer to a side of the first cathode terminal than the intersection, and the third capacitive element is also provided closer to a side of the first anode terminal than the intersection.

5. The power conversion device according to claim 4, wherein the second cathode wiring is composed of a cathode bus bar, and the second anode wiring is composed of an anode bus bar.

6. The power conversion device according to claim 4, further comprising:

an LC filter, wherein the LC filter includes a parasitic inductance included in the second cathode wiring;

a parasitic inductance included in the second anode wiring; and a capacitance of the first capacitive element.

* * * * *